(12) United States Patent
Ahn et al.

(10) Patent No.: US 6,306,681 B1
(45) Date of Patent: Oct. 23, 2001

(54) MULTICHIP MODULE WITH BUILT IN REPEATERS AND METHOD

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/376,935

(22) Filed: Aug. 18, 1999

Related U.S. Application Data

(62) Division of application No. 09/199,704, filed on Nov. 24, 1998, now Pat. No. 6,137,167.

(51) Int. Cl.[7] .................................................. H01L 21/82
(52) U.S. Cl. ............................. 438/107; 438/128; 438/6; 438/10; 257/691; 361/728; 439/55
(58) Field of Search .................................... 438/128, 129, 438/130, 131, 132, 108; 257/691; 361/600, 679, 728, 820; 439/55

(56) References Cited

U.S. PATENT DOCUMENTS 5,854,534 * 12/1998 Beilin et al. .
5,895,978 * 4/1999 Palagonia .

OTHER PUBLICATIONS

Rump Sessions—Technology and Circuits Joint Rump Session—RJ1 High Performance Technology for 1Ghz Operation and Beyond, Architecture, Design, and Device Solutions, IEEE, 1998 Symposium on VLSI Techonology Digest of Technical Paper: p. 142, Jun., 1998.

Victor Adler et al., "Repeater Design to Reduce Delay and Power in Resistive Interconnect," *IEEE Trans. On Circuits and Systems–II, Analog and Digital Signal Processing* 45, (5) pp. 607–610, May, 1998.

Andrew B. Kahng et al "Interconnect Tuning Strategies for High Performance ICs," Proceedings of Design, Automation, and Test in Europe, Feb. 23–26, 1998, Paris, France, pp. 471–478.

A. Rjoub et al, "An Efficient Low–Power Bus Architecture," Proceedings of 1997 IEEE International Symposium on Circuits and Systems, Jun. 9–12, 1997, Hong Kong, pp. 1864–1867.

D. Li et al, "A Repeater Optimization Methodology for Deep Sub–Micron, High–Performance Processors," Proceedings of International Conference on Computer Design, VLSI in Computers and Processors, pp. 726–731, Oct., 1997.

Dennis Sylvester et al, "Interconnect Scaling: Signal Integrity and Performance in Future High–Speed CMOS Designs," 1998 Symposium on VLSI Technology Digest of Technical Papers, pp. 42–43, Jun., 1998.

(List continued on next page.)

*Primary Examiner*—Charles Bowers
*Assistant Examiner*—Stephen W. Smoot
(74) *Attorney, Agent, or Firm*—Dorsey & Whitney LLP

(57) ABSTRACT

A multichip module includes an interposer formed from a semiconductor material and having a plurality of interconnections formed on a surface of the interposer. A plurality of integrated circuits is mounted on the interposer and is electrically coupled to the interconnections. One or more repeater circuits are disposed along a length of at least one of the plurality of interconnections. A lid seals the plurality of integrated circuits from environmental insults. As a result, RC transmission line effects and crosstalk effects are reduced for signals propagating from one of the integrated circuits to another across the surface of the interposer. Additionally, thermal coefficient of expansion mismatch is reduced or eliminated between the integrated circuits and interposer.

7 Claims, 4 Drawing Sheets

OTHER PUBLICATIONS

Alina Deutsch et al, "When are Transmission Line Effects Important for On–Chip Interconnections?" *IEEE Trans. On Microwave Theory and Techniques*, vol. 45(10), pp. 1836–1844, Oct., 1997.

Jason D. Reed et al, "High Frequency IC to IC Signaling on Rapidly Prototyped Flip Chip MCM–D Substrate," Proceedings of 1998 International Conference. On Multichip Modules and High Density Packaging, pp. 172–177, Apr., 1998.

J. Hartung, "Integrated Passive Components in MCM–Si Technology and their Applications in RF–Systems," 1998 International Conference on Multichip Modules and High-–Density Packaging, pp. 256–261, Apr., 1998.

R.L. Keusseyan et al, "New Low Cost Interconnection Materials for High Frequency MCM Applications," 1998 International Conference on Multichip Modules and High Density Packaging, pp. 206–211, Apr., 1998.

* cited by examiner

MULTICHIP MODULE WITH BUILT IN REPEATERS AND METHOD

CROSS-REFERENCE TO RELATED APPLICATION

This application is a divisional of U.S. patent application Ser. No. 09/199,704, filed Nov. 24, 1998, now U.S. Pat. No. 6,137,167.

TECHNICAL FIELD

This invention relates generally to multichip modules and more particularly to multichip modules using interposers formed from semiconductor material.

BACKGROUND OF THE INVENTION

Digital circuits in particular have increased in complexity, density, operating frequency and utility at an astonishing rate over the last several decades. Additionally, increasing functional specialization for integrated circuits has developed as integrated circuit technology has matured. Integrated circuits developed for one set of tasks, such as microprocessors for manipulating digital data, require a first set of process steps. Integrated circuits developed for another set of tasks, such as DRAMs for storing digital data, require a second set of process steps. Integrated circuits developed for a still different set of tasks, such as RF transmitters or receivers for coupling data between devices, require still another set of process steps. The cumulative effect of defects in integrated circuit manufacturing results in a strong preference for using as few processing steps as possible to provide a given integrated circuit function.

For example, if yields for each mask level are 90%, four masking steps result in a total yield of 65%, while six masking steps result in a yield of 53% and eight masking steps result in a yield of 43%. Complex integrated circuits may require several dozen masking steps. Accordingly, there are significant advantages to avoiding exposing a wafer of semiconductor material that will include a microprocessor to masking steps unique to forming DRAMs or RF circuits and vice versa.

As a result, there are economic advantages associated with forming a module or system from an interconnected group of different types of previously-tested integrated circuits (i.e., known good die). Further advantages can result from mounting the different types of integrated circuits in die form on a common substrate and then encapsulating the composite assembly in a package common to all of the die to form a module, known as a multichip module or MCM. In MCMs, the die are interconnected to wiring formed on the common substrate, also known as an interposer, using conventional interconnection technology.

As the area of each die in the MCM increases, thermal coefficient of expansion mismatch between the die and the interposer becomes increasingly critical, at least in part because the thickness of the material forming the die is not increased as the area of the die is increased. One solution to this problem is to make the interposer from the same material that the die are made from, i.e., silicon. This allows increasingly complex integrated circuits to be interconnected without exaggerating thermal coefficient of expansion mismatch problems that could occur either during packaging or as a result of thermal cycling in normal use. Additionally, passive components may be formed or mounted on the interposer, as described in "High Frequency IC to IC Signaling on Rapidly Prototyped Flip Chip MCM-D Substrate", by J. Reed et al., 1998 Int. Conf. on MCMs and High Density Packaging, IEEE Cat. No. 0-7803-4850-8/98, pp. 172–177.

For example, "Integrated Passive Components in MCM-Si Technology and their Applications in RF-Systems," by J. Hartung, 1998 Int. Conf. on MCMs and High Density Packaging, pp. 256–261, IEEE Cat. No. 0-7803-4850-8/98, describes an approach whereby multiple aluminum layers are conventionally formed and patterned on the silicon interposer to provide interconnections. The aluminum layers are separated by conventional $Si_3N_4$ interlevel dielectric layers, allowing capacitors to be formed on the silicon interposer. Additionally, a TaSi layer is formed and patterned on the silicon interposer to provide resistors.

However, increasing circuit functionality and the density of components within integrated circuits continue to increase demand for progressively smaller linewidths, both within the integrated circuits themselves and on the interposer. As linewidths shrink, RC transmission line effects in interconnections increase, particularly in longer interconnections. Additionally, these effects are more pronounced as operating frequencies increase. Often, a simple lumped-element model is used to approximate RC effects in long interconnections. Because both the resistance and the capacitance of the interconnection are linearly proportional to the length of the interconnection, signal propagation delays along the interconnection can be modeled as being proportional to the square of the length of the interconnection. Signals traveling along relatively long interconnections suffer delays and other forms of distortion due to frequency-dependent attenuation and cross-coupling between interconnections. As a result, signals transmitted along such interconnections may be corrupted, slowing operation of integrated circuits or even causing failure. "Interconnect Scaling: Signal Integrity and Performance in Future High-Speed CMOS Designs," by D. Sylvester et al., 1998 Int. Conf. on MCMs and High Density Packaging, pp. 42–43, IEEE Cat. No. 0-7803-4850-8/98, discusses signal corruption in transmission of signals within ultra large scale integration CMOS integrated circuits as linewidths shrink and signal propagation distances increase.

Increasing circuit functionality not only increases the density and decreases the width of interconnections, but it also inherently increases the lengths of interconnections as die sizes increase to accommodate the increased functionality. Increased interconnection lengths further exacerbate the above-described problems.

There is therefore a need for improved interconnection technology in MCMs in order to be able to provide MCMs that can accommodate both higher operating frequencies and greater interconnection densities.

SUMMARY OF THE INVENTION

In one aspect, the present invention includes a method for coupling signals between a plurality of integrated circuits mounted on an interposer. The method includes coupling signals from a first integrated circuit mounted on the interposer to one segment of an interconnection formed on the interposer, propagating the signals for one distance along the one segment and detecting the signals by a repeater circuit coupled to the interposer. The method also includes regenerating the signals by the repeater circuit and coupling the regenerated signals to another segment of the interconnection, allowing the regenerated signals to be coupled to another of the integrated circuits.

In another aspect, the present invention includes an interposer having utility in multichip modules. The interposer includes a wafer of semiconductor material and a plurality of interconnections formed on a surface of the wafer. One or more repeater circuits are disposed on the wafer and are electrically coupled to lengths of one or more of the plurality of interconnections.

In one aspect, multiple integrated circuit die are mounted on the interposer and are electrically interconnected by the interconnections and the repeater circuits. The integrated circuits may include microprocessors, memory integrated circuits such as DRAMs or SRAMs or specialized I/O integrated circuits. Passive components may be formed on or mounted on the interposer.

As a result, integrated circuit die that are formed from the same type of semiconductor material as the interposer have thermal coefficients of expansion that are matched to that of the interposer, reducing thermal stress effects when the integrated circuit die are mounted on the interposer. Significantly, the repeater circuits modify quadratic RC transmission delays experienced by signals coupled across the interposer in the interconnections. Crosstalk between interconnections and power dissipation are reduced by proper placement of the repeater circuits and the interconnections on the interposer. The repeater circuits may be formed monolithically in the interposer or may be separate integrated circuits that are coupled to the interposer.

In one aspect, the integrated circuits, the interconnections and the repeater circuits are enclosed by a lid. As a result, contents of the multichip module are protected from mechanical and chemical attack.

DETAILED DESCRIPTION OF THE INVENTION

Figure 1:
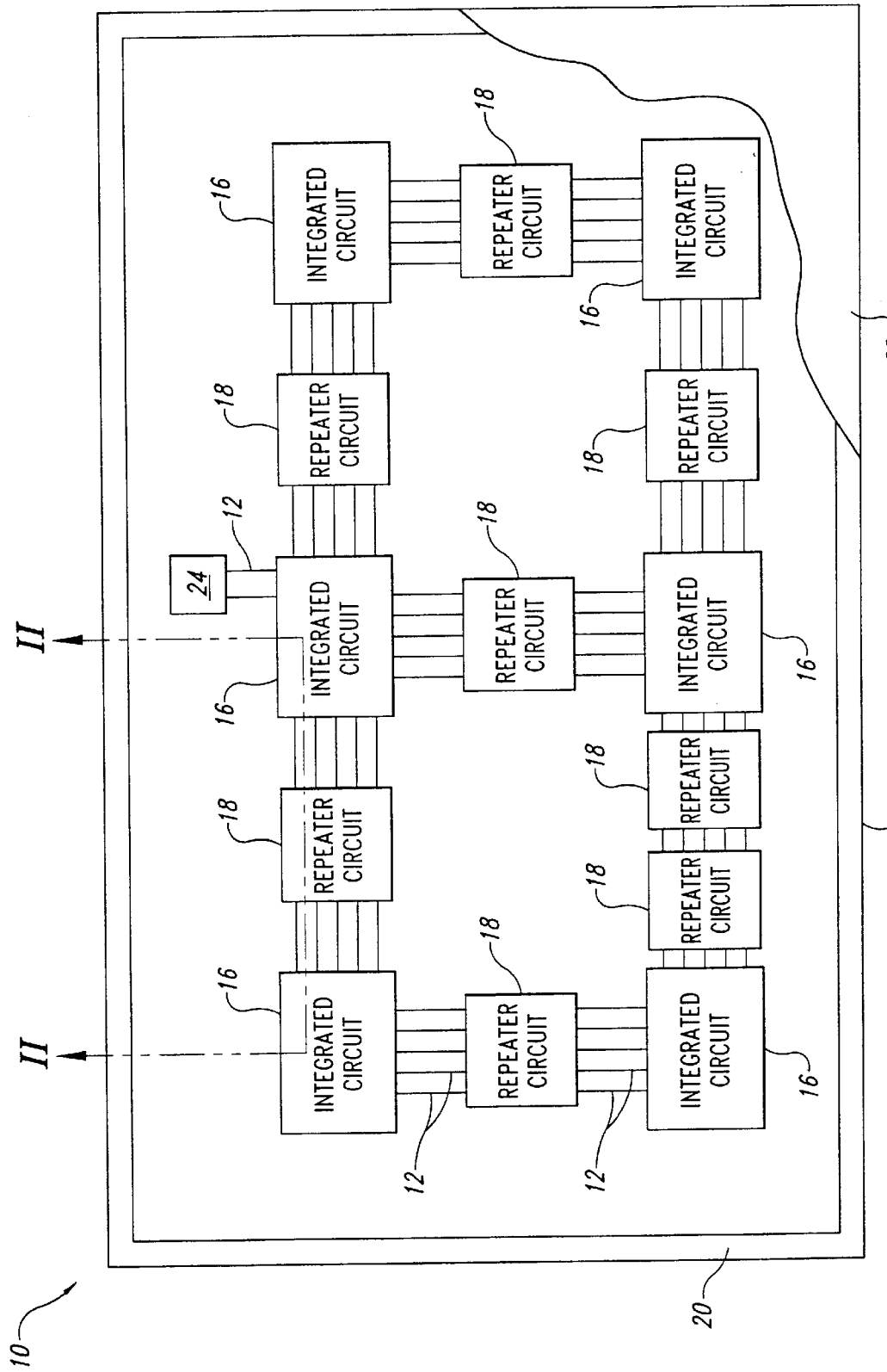
FIG. 1 is a simplified plan view of a multichip module, in accordance with an embodiment of the present invention.

FIG. 1 is a simplified plan view of a multichip module 10, in accordance with an embodiment of the present invention. The MCM 10 includes interconnections 12 formed on surface portions of an interposer 14. In one embodiment, the interposer 14 is formed from silicon. Integrated circuits 16 are physically secured and electrically connected to the interposer 14 by any suitable conventional technology. The integrated circuits 16 may include DRAM or SRAM memories, microprocessors, controllers, microcontrollers, power conditioning circuits, sensor circuits, interfacing and communications circuits, or any other type of known or future developed circuits.

In one embodiment, repeater circuits 18 are also coupled to the interposer 14. The repeater circuits 18 detect signals transmitted from one of the integrated circuits 16, correct slew rate degradation of transitions in these signals and also correct signal amplitude degradation to provide regenerated signals. The regenerated signals are then retransmitted by the repeater circuits 18 to either another of the repeater circuits 18 or to another one of the integrated circuits 16 that is the intended destination of the signals. As a result, the quadratic signal delay associated with long interconnections 12 having RC transmission line characteristics is converted to a linear signal propagation delay.

The interposer 14 also includes a region 20 for attachment of a package lid 22, shown in a partial cutaway view in FIG. 1. The package lid 22 may be a metal lid 22 that is attached to a metallized region 20 by welding or a ceramic lid 22 that is attached to a region 20 coated with a low temperature glass frit by firing the frit in an oven. The lid 22 and the interposer 14 then form a complete package surrounding the integrated circuits 16, the interconnections 12 and the repeater circuits 18. The package then protects the "guts" of the MCM 10 from damage that otherwise could result from mechanical abrasion, puncture or chipping, chemical attack and other environmental insults.

A passive component 24 is also shown in FIG. 1. The passive component 24 may be a high value capacitor, such as a tantalum or electrolytic capacitor for power conditioning, or may be a sensor, such as a Hall effect sensor, accelerometer (e.g., employing a piezoresistive membrane coupled to a motion-sensing mass), thermistor or thermocouple, optical sensor or transmitter (e.g., photodiode, laser, LED or the like) or may be a frequency selection component such as a SAW or crystal, or may be any other known or future developed circuit component. Capabilities for interconnecting components 24 that achieve functions not generally possible for the integrated circuits 12 can result in increased performance for the MCM 10.

Figure 2:
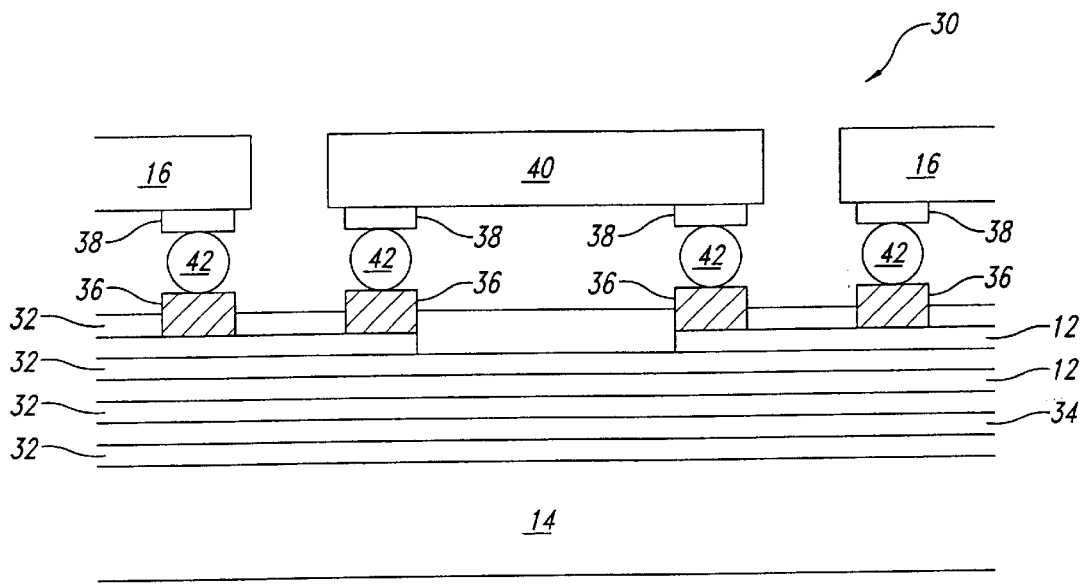
FIG. 2 is a simplified cross-sectional view, taken along section lines II—II of FIG. 1, of an embodiment of a multichip module, in accordance with an embodiment of the present invention.

FIG. 2 is a simplified cross-sectional view, taken along section lines II—II of FIG. 1, of an embodiment of a MCM 30, in accordance with some embodiments of the present invention. Many of the components used in the embodiment of the MCM 30 of FIG. 2 are identical to components used in the embodiment of the MCM 10 of FIG. 1. Therefore, in the interest of brevity, these components have been provided with the same reference numerals, and an explanation of them will not be repeated.

In one embodiment, one or more insulating layers 32 formed on a surface of the interposer 14 insulate at least portions of an optional resistive layer 34 and the interconnections 12. It will be appreciated that while four insulating layers 32, one resistive layer 34 and two interconnection layers 12 are shown in FIG. 2, more or fewer layers may be employed as required for a given application. Conventional bond pads 36 formed on the interposer electrically couple interconnections 12 to bond pads 38 formed on the integrated circuit die 16 and on integrated circuit die 40 that include the repeater circuits 18 of FIG. 1 through solder bumps 42. The solder bumps 42 may be formed on the bond pads 36, the bond pads 38 or both. The die 16 and 40 are inverted, placed appropriately on the interposer 14 and the resulting composite assembly is then soldered together, for example through conventional vapor phase soldering. Other conventional methods of physical interconnection (e.g., eutectic alloy etc.) and electrical interconnection (e.g., bond wire etc.) may be employed.

The interconnections 12 may be formed from any conductor, such as polysilicon or a metal, such as aluminum or gold. The insulating layers 32 may be formed from any non-conductor, such as silicon nitride, silicon dioxide, polyimide or any other dielectric material that may be formed into uniformly thick, pinhole-free layers on the interposer 14. Gold and aluminum alloys (e.g., Al/Cu, Al/Ti) employing precipitation hardening provide increased electromigration resistance compared to pure aluminum. The optional resistive layer 34 may be formed from TaN, TaSi, NiCr or any other material providing electrical continuity, uniformity and appropriate resistivity.

"New Low Cost Interconnection Materials For High Frequency MCM Applications," by R. L. Keusseyan et al., 1998 Int. Conf. on MCMs and High Density Packaging, pp. 206–211, IEEE Cat. No. 0-7803-4850-8/98, describes thick film gold conductors providing superior fine line definition and high frequency performance together with high conductivity and density. Lines having seventy five micron resolution are screen printed using fine metal mesh screens. Lines having ten micron resolution can be formed by etching the deposited gold film after firing.

Figure 3:
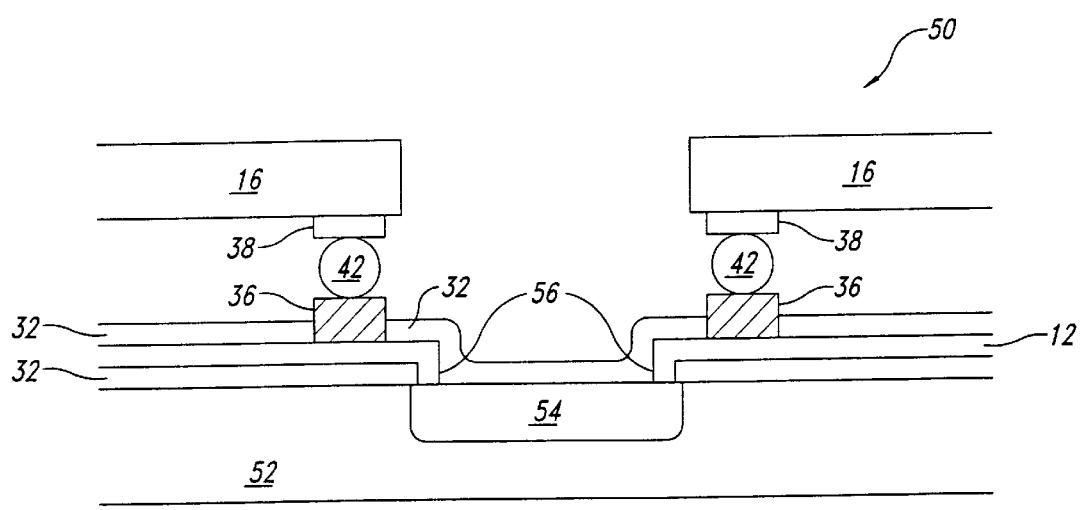
FIG. 3 is a simplified cross-sectional view, taken along section lines II—II of FIG. 1, of an embodiment of a multichip module, in accordance with an embodiment of the present invention.

FIG. 3 is a simplified cross-sectional view, taken along section lines II—II of FIG. 1, of another embodiment of a multichip module 50, in accordance with an embodiment of the present invention. The MCM 50 includes an interposer 52 having the repeater 18 of FIG. 1 formed as a repeater circuit 54 that is integrated directly into semiconductor material forming the interposer 52. In one embodiment, the semiconductor material forms the bulk of the interposer 52 and may include silicon, germanium, gallium arsenide or other elemental, compound or polymeric semiconductor material. In another embodiment, the semiconductor material may be a layer formed on an insulating material forming the bulk of the interposer 52 or 14. It will be appreciated that, while only two insulating layers 32 and one interconnective layer 12 are shown in FIG. 3, more or fewer layers may be employed as required for a given application.

The repeater circuit 54 is electrically coupled to the interconnections 12 through conventional conductive plugs 56 extending through vias formed in the insulating layers 32. The insulating layer 32 extending across the repeater circuit 54 forms a conventional passivation layer protecting the repeater circuit 54 from materials involved in fabrication processes subsequent to formation of the repeater circuit 54. In one embodiment, the repeater circuit 54 is a CMOS repeater circuit, although other types of repeater circuits may be formed.

Figure 4:
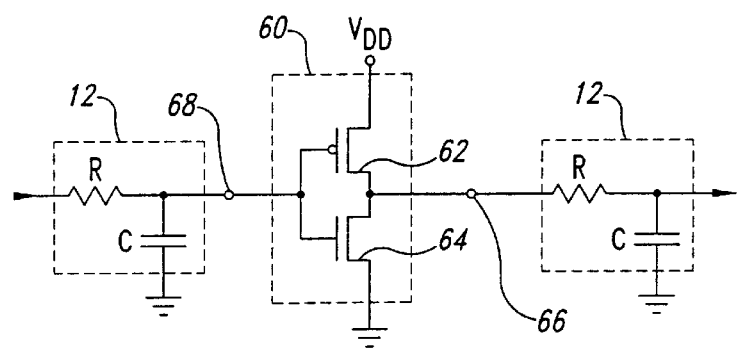
FIG. 4 is a simplified schematic diagram of a CMOS repeater circuit, in accordance with an embodiment of the present invention.

FIG. 4 is a simplified schematic diagram of a CMOS repeater circuit 60, in accordance with some embodiments of the present invention. The CMOS repeater circuit 60 is an inverter including a PMOS FET 62 having a first power electrode coupled to a supply voltage $V_{DD}$. The FET 62 includes a second power electrode coupled to a first power electrode of an NMOS FET 64, forming an output 66 of the CMOS repeater circuit 60. The output 66 is coupled to an interconnection 12, shown as an RC equivalent circuit in FIG. 4. Control electrodes for both FETs 62 and 64 are coupled to an input 68 and thus to another interconnection 12, also shown as an RC equivalent circuit. The input 68 and the output 66 correspond to the plug and via 56 of FIG. 3 or the bond pads 36 and 38 and the solder bump 42 of FIG. 2.

Gate widths for the FETs 62 and 64 are chosen in view of impedance levels presented by the interconnection 12 to be driven and also to reduce power dissipation in the CMOS repeater circuit 60. An alternative approach to reducing power dissipation is to use a repeater circuit having reduced output voltage swing.

Signals that have suffered slew rate degradation cause excessive power consumption and reduced noise immunity. Power consumption rises because, as the signal is crossing a midpoint value, both of the FETs 62 and 64 are turned ON, giving rise to what is known as "short circuit current." As the slew rate becomes slower, the amount of time during which both FETs 62 and 64, or their counterparts in the receiving integrated circuit 16 (FIGS. 1–3) are turned ON, increases.

Power consumption is reduced by inserting repeater circuits, such as the repeater circuit 60, at distances that obviate long slew times. Additionally, during the time where the signal is near the midpoint, noise can cause false triggering of the receiving integrated circuit 16 or of the repeater circuits 60. Again, this problem is alleviated by proper placement of the repeater circuits 60.

Figure 5:
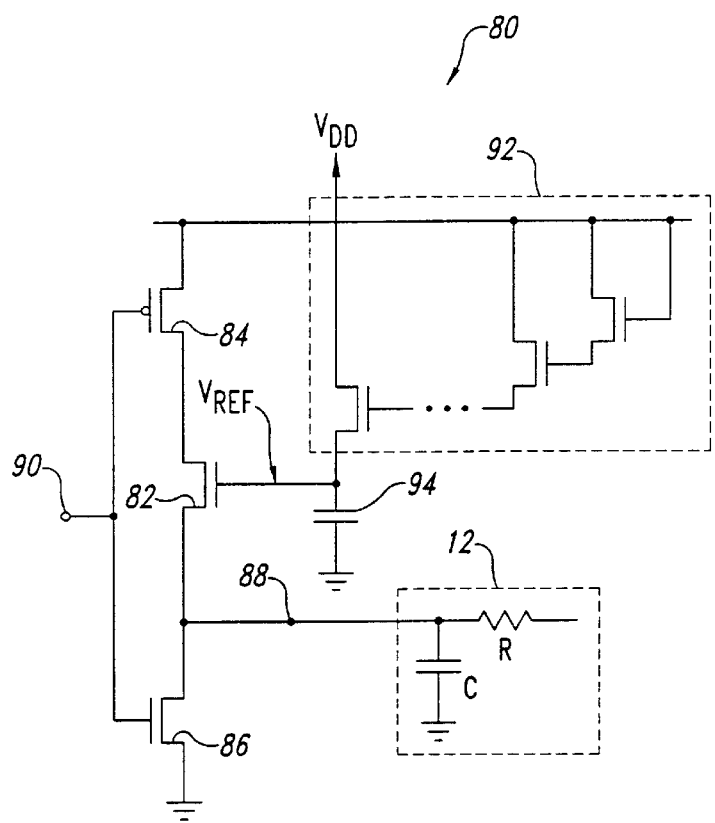
FIG. 5 is a simplified schematic diagram of a driver circuit employing reduced output voltage swing, in accordance with an embodiment of the present invention.

FIG. 5 is a simplified schematic diagram of a driver circuit 80 employing reduced output voltage swing, in accordance with some embodiments of the present invention. The driver circuit 80 includes an additional NMOS FET 82 coupled between a PMOS FET 84 and an NMOS FET 86. The FETs 84 and 86 are analogous to the FETs 62 and 64 of FIG. 4. Howeyer, the gate of the FET 82 is biased to a reference voltage $V_{REF}$ that is less than the normal supply voltage $V_{DD}$. As a result, the maximum output voltage on an output node 88 in response to a logical "0" at an input node 90 cannot exceed a voltage given as $V_{REF}-V_{T82}$, where $V_{T82}$ corresponds to a threshold voltage of the FET 82. Output signals to the interconnection 12 have a reduced voltage swing compared to normal digital signal voltages.

In one embodiment, the voltage $V_{REF}$ is provided by a group of n many diode-connected FETs coupled in a cascade and collectively represented by a reference number 92. $V_{REF}$ is thus $V_{DD}-nV_{T92}$, where $V_{T92}$ represents a threshold voltage of the FETs in the group of FETs 92. A capacitor 94 is included having a capacitance that is preferably at least ten times a source-gate capacitance of the FETs 82 and 92.

In one embodiment, the capacitor 94 is formed as a MOS structure, i.e., with one plate of the capacitor 94 formed as a metallic or polysilicon contact on a dielectric, such as a gate oxide, and the other plate of the capacitor 94 formed as an inversion layer of minority charge carriers in semiconducting material on another side of the dielectric. The capacitor 94 prevents charge trapped in parasitic capacitances of the FET 82 from inhibiting proper operation of the circuit 80. It will be appreciated that other conventional voltage reference sources, such as a conventional resistive voltage divider, may be employed instead of the group of FETs 92.

Figure 6:
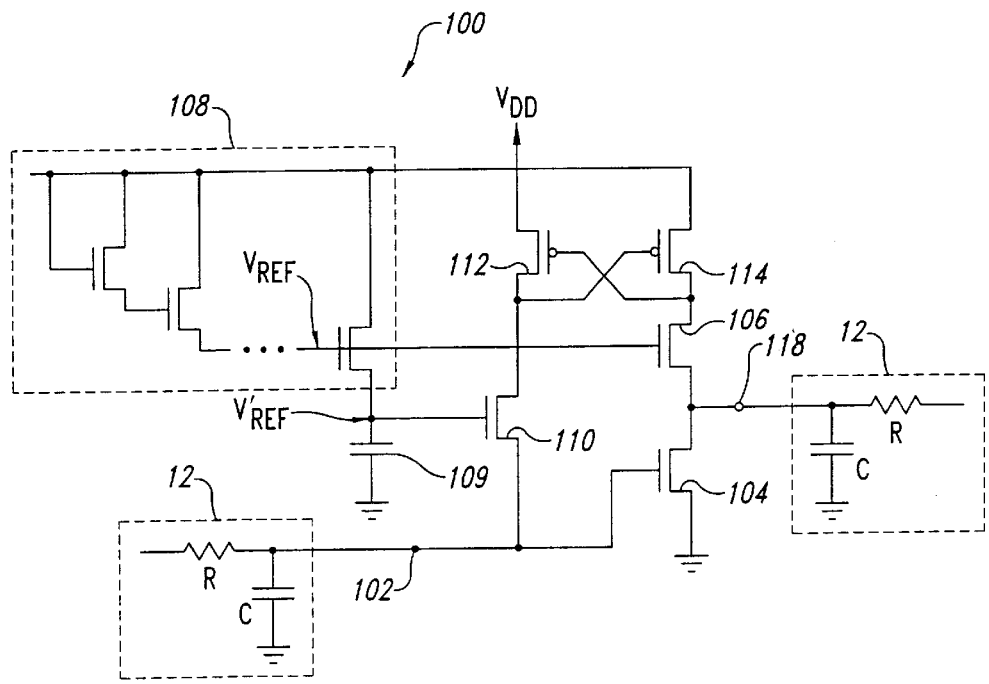
FIG. 6 is a simplified schematic diagram of a repeater circuit employing reduced input and output voltage swing, in accordance with an embodiment of the present invention.

FIG. 6 is a simplified schematic diagram of a repeater circuit 100 employing reduced input and output voltage swing, in accordance with some embodiments of the present invention. The repeater circuit 100 includes an input node 102 coupled to a first interconnection 12. The input node drives an output NMOS FET 104 having a maximum voltage set by an NMOS FET 106. The FET 106 is analogous to the FET 82 of FIG. 5, and has a gate that is coupled to a voltage $V_{REF}$ generated by a group of FETs 108 analogous to the group of FETs 92 of FIG. 5. The group of FETs 108 differs from the group of FETs 92 by providing two reference voltages $V_{REF}$ and $V'_{REF}$, where $V_{REF}-V'_{REF}=V_T$. A capacitor 109 is analogous to the capacitor 94 of FIG. 5. The voltage $V'_{REF}$ is coupled to a gate of a FET 110. When the input node 102 is driven to logical "1", the FET 110 is turned OFF, and the FET 104 is turned ON, turning ON the FET 106. In turn, a PMOS FET 112 is turned ON, turning OFF a PMOS FET 114 that is cross-coupled with the FET 112. As a result, an output node 118 that is coupled to another interconnection 12 is set to logical "0".

Similarly, when the input node 102 is driven to logical "0", the FET 104 is turned OFF and the FET 110 is turned ON, resetting the cross-coupled FETs 112, 114 and setting the output node 118 to logical "1".

Figure 7:
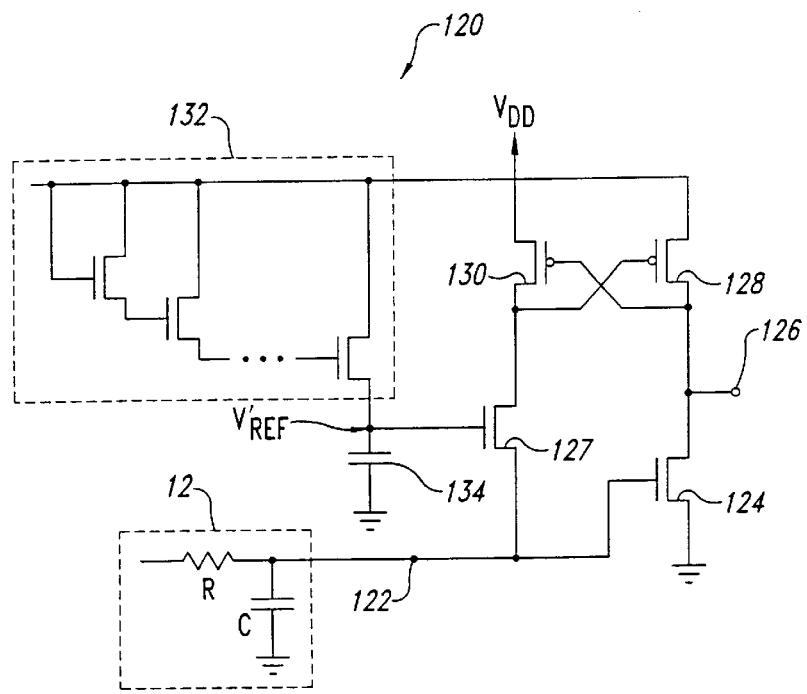
FIG. 7 is a simplified schematic diagram of a receiver circuit employing reduced input voltage swing, in accordance with an embodiment of the present invention.

FIG. 7 is a simplified schematic diagram of a receiver circuit 120 employing reduced input voltage swing, in accordance with embodiments of the present invention. Input signals on an interconnection 12 are coupled to an input node 122 and thereby to a gate of an NMOS FET 124. An output signal having full voltage swing is then coupled to an output node 126 by the FET 124 in cooperation with FETs 127, 128, 130, a group of FETs 132 and a capacitor 134. These components behave similarly to their counterparts in FIG. 6 and are not discussed further for this reason.

"An Efficient Low-Power Bus Architecture," by A. Rjoub et al., Proc. Int. Conf. on Computer Des., VLSI in Comp. and Proc., IEEE Cat. No. 1063-6404/97, pp. 1864–1867, discusses the circuits of FIGS. 5–7 and their application within an integrated circuit. Optimizing the number of FETs 132 results in power savings without excessive delay increase.

"A Repeater Optimization Methodology for Deep Sub-Micron, High-Performance Processors," by D. Li et al., Proc. Int. Conf. on Computer Des., VLSI in Comp. and Proc., IEEE Cat. No. 1063-6404/97, pp. 726–731, discusses design considerations for repeaters in integrated circuits from a perspective including cross-talk considerations in addition to RC delay and distortion effects. The reduced voltage swing circuits 80, 100 and 120 provide cross-talk improvements when implemented on (FIG. 2) or in (FIG. 3) the interposer 14 or 52 (FIGS. 1–3).

The interconnections 12 of FIGS. 1–3 may be tuned for specific applications by altering line widths and spacings, dielectric coatings on the interconnections 12, insertion of the repeaters 18 or by inclusion of shielding. For situations where capacitive coupling between lines are limiting factors due to signal propagation delay and delay variation, increased spacing between interconnections 12 and/or reduced dielectric constant insulating layers 32 improves signal propagation characteristics. For example, transition from a $SiO_2$ insulator with a relative dielectric constant of $\in_R=4$ to a polymer (e.g., polyimide) with a relative dielectric constant $\in_R=3$ leads to up to 25% performance improvement.

For situations where large currents are being conducted or where high resistance leads to resistive coupling through ground resistance (e.g., power supply lines), the cross-sectional area of the interconnections may be increased by making them wider or thicker or both, or by connecting multiple conductors in parallel. In extreme cases, one or more entire planes of interconnection material 12 may be used. Current return path considerations are important for reduction of clock skew, for example.

Longer interconnections 12, such as global data busses, control and clock lines, need reduced resistance as well as increased characteristic impedance and thus also require thicker insulating layers 32 and also need greater separations between interconnections 12. Critical signal interconnections 12 may be selectively shielded by controlling spacing from other interconnections 12, by including grounded interconnections 12 to either side of the critical interconnection 12 or by including grounded interconnections 12 above or below the critical interconnection 12. "When are Transmission-Line Effects Important for On-Chip Interconnections?," by A. Deutsch et al., IEEE Trans. Mic. Th. and Tech., Vol. 45, No. 10, October 1997, pp. 1836–1844, analyzes a number of different cases in the context of signal propagation within an integrated circuit in detail.

Other techniques for reducing crosstalk between adjacent interconnections 12 include staggering the position of inverting repeaters 18, 40, 54, 60, 80 or 100 of FIGS. 1–6, respectively, so that relative phases of signals coupled into a first segment of an interconnection 12 are 180° removed from relative phases of signals coupled into a second segment of the interconnection 12, leading to destructive interference between the signals coupled into the two segments. "Interconnect Tuning Strategies for High Performance ICs," by A. B. Kahng et al., Proc. Des. Automat. and Test in Eur., Feb. 23–26, 1998, IEEE Cat. No. 0-8186-8359-7/98, pp. 471–479, analyzes a variety of techniques for interconnect tuning. Other multiphase staggering schemes for interference reduction through crosstalk cancellation are possible as well. In one embodiment, even numbers of inverting repeater circuits 18, 40, 54, 60 (FIGS. 1–4, respectively) or 100 (FIG. 6), which may be staggered as discussed above, appear between a first integrated circuit 16 transmitting a signal and a second integrated circuit 16 receiving the signal (zero is considered to be an even number for this purpose).

"Repeater Design to Reduce Delay and Power in Resistive Interconnect," by V. Adler et al., IEEE Trans. Cir. and Syst., Vol. 45, No. 5, May 1998, pp. 607–616, discusses power dissipation advantages made possible through use of reduced voltage swings when repeaters are included in signal propagation paths on integrated circuits. Additionally, this paper shows that uniformly sized, serially coupled repeaters provide performance advantages for driving RC loads, in contrast to driving purely capacitive loads, where progressively larger, serially coupled repeaters outperform uniformly sized, serially coupled repeaters.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for coupling signals between a plurality of integrated circuits mounted on an interposer comprising:
    coupling signals from a first integrated circuit mounted on the interposer to one segment of an interconnection formed on the interposer;
    propagating the signals for one distance along the one segment;
    detecting the signals by a repeater circuit formed monolithically within the interposer;
    regenerating the signals by the repeater circuit; and
    coupling the regenerated signals to another segment of the interconnection.

2. The method of claim 1 wherein the act of detecting the signals is comprised of detecting the signals by a repeater circuit formed monolithically within the interposer that is covered by an insulation layer extending substantially across the repeater circuit.

3. The method of claim 1, further comprising:
    propagating the regenerated signals another distance along the another segment of the interconnection; and receiving the regenerated signals at a second of the integrated circuits mounted on the interposer.

4. The method of claim 1, further comprising repeating the acts of detecting, regenerating and coupling the regenerated signals to another segment of the interconnection for a predetermined number of iterations.

5. The method of claim 1, further comprising repeating the acts of detecting, regenerating and coupling the regenerated signals to another segment of the interconnection for a predetermined number of iterations using repeater circuits of equal load driving capability.

6. The method of claim 1 wherein the acts of detecting, regenerating and coupling the regenerated signals to another segment of the interconnection comprise detecting, regenerating and coupling the regenerated signals to another segment of the interconnection by a CMOS repeater circuit.

7. The method of claim 1 wherein the act of coupling signals from a first integrated circuit comprises coupling signals having a reduced maximum voltage from the first integrated circuit mounted on the interposer to one segment of an interconnection formed on the interposer.

* * * * *

UNITED STATES PATENT AND TRADEMARK OFFICE
CERTIFICATE OF CORRECTION

PATENT NO. : 6,306,681 B1  
DATED : October 23, 2001  
INVENTOR(S) : Kie Y. Ahn and Leonard Forbes It is certified that error appears in the above-identified patent and that said Letters Patent is hereby corrected as shown below:

<u>Title page,</u>
Item [56], "OTHER PUBLICATIONS", reads "610" should read -- 616 --

Signed and Sealed this

Twenty-seventh Day of August, 2002

Attest:

JAMES E. ROGAN  
*Attesting Officer*       *Director of the United States Patent and Trademark Office*